(12) United States Patent
Bohn et al.

(10) Patent No.: US 6,762,134 B2
(45) Date of Patent: Jul. 13, 2004

(54) METAL-ASSISTED CHEMICAL ETCH TO PRODUCE POROUS GROUP III-V MATERIALS

(75) Inventors: Paul W. Bohn, Champaign, IL (US); Xiuling Li, Champaign, IL (US); Jonathan V. Sweedler, Urbana, IL (US); Ilesanmi Adesida, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 105 days.

(21) Appl. No.: 09/989,050

(22) Filed: Nov. 20, 2001

(65) Prior Publication Data

US 2002/0074314 A1 Jun. 20, 2002

Related U.S. Application Data

(60) Provisional application No. 60/253,305, filed on Nov. 27, 2000.

(51) Int. Cl.$^7$ ............................................. H01L 21/302
(52) U.S. Cl. ......................... 438/745; 438/750; 216/56; 205/606; 205/665
(58) Field of Search .............................. 438/745, 750; 216/56, 103; 205/606, 665, 674

(56) References Cited

U.S. PATENT DOCUMENTS

| | | | |
|---|---|---|---|
| 3,653,989 A | 4/1972 | Widmer | |
| 4,078,945 A | 3/1978 | Gonsiorawski | |
| 4,092,445 A | 5/1978 | Tsuzuki et al. | |
| 4,353,779 A | * 10/1982 | Przybysz | 156/345 |
| 4,681,657 A | 7/1987 | Hwang et al. | |
| 5,089,293 A | 2/1992 | Bohara et al. | |
| 5,139,624 A | 8/1992 | Searson et al. | |
| 5,206,523 A | 4/1993 | Goesele et al. | |
| 5,552,328 A | 9/1996 | Orlowski et al. | |
| 5,695,557 A | 12/1997 | Yamagata et al. | |
| 5,767,020 A | 6/1998 | Sakaguchi et al. | |
| 5,868,947 A | 2/1999 | Sakaguchi et al. | |
| 5,873,003 A | 2/1999 | Inoue et al. | |
| 5,895,223 A | * 4/1999 | Peng et al. | 438/18 |
| 5,970,361 A | 10/1999 | Kumomi et al. | |
| 5,981,400 A | 11/1999 | Lo | |
| 5,990,605 A | * 11/1999 | Yoshikawa et al. | 313/310 |
| 6,017,811 A | 1/2000 | Winton et al. | |
| 6,093,941 A | 7/2000 | Russell et al. | |

OTHER PUBLICATIONS

T. Monguchi, H. Fujioka, K. Ono, Y. Baba, M. Oshima, "Effects of Wet Etching on Photoluminescence of Porous Silicon", *Journel of The Electrochemical Society*, vol. 147, No. 2, 2000, pp. 602–605.

J. Salonen, V.P. Lehto, M. Bjorkqvist, E. Laine, "A Role of Illumination During Etching to Porous Silicon Oxidation", *Applied Physics Letters*, vol. 75, No. 6, Aug. 9, 1999, p. 826–828.

T. Tsuboi, T. Sakka, Y. H. Ogata, "Chemical Etching of Porous Silicon in Diluted Hydrofluoric Acid", *Solid State Communications*, vol. 109, 1999, pp. 195–199.

T. Tsuboi, T. Sakka, Y. H. Ogata, "Chemical Etching of Porous Silicon in Diluted Hydrofluoric Acid", *Solid State Communications*, vol. 109, 1999, pp. 195–199.

D. Dimova–Malinovska, M. Sendova–Vassileva, N. Tzenov and M. Kamenova, "Preparation of Thin Porous Silicon Layers by Stain Etching", *Thin Solid Films*, 297, 1997, pp. 9–12.

\* cited by examiner

*Primary Examiner*—Lan Vinh
(74) *Attorney, Agent, or Firm*—Greer, Burns & Crain, Ltd.

(57) ABSTRACT

A thin discontinuous layer of metal such as Au, Pt, or Au/Pd is deposited on a Group III-V material surface. The surface is then etched in a solution including HF and an oxidant for a preferably brief period, as little as a couple seconds to one hour. A preferred oxidant is $H_2O_2$. Morphology and light emitting properties of porous Group III-V material can be selectively controlled as a function of the type of metal deposited, doping type, doping level, metal thickness, whether emission is collected on or off the metal coated areas and/or etch time. Electrical assistance is unnecessary during the chemical etching of the invention, which may be conducted in the presence or absence of illumination.

23 Claims, No Drawings

METAL-ASSISTED CHEMICAL ETCH TO PRODUCE POROUS GROUP III-V MATERIALS

REFERENCE TO RELATED APPLICATION

This application is related to prior provisional application Serial No. 60/253,305 filed Nov. 27, 2000. This application claims priority from that prior application under 35 U.S.C. §119.

FIELD OF THE INVENTION

The field of the invention is semiconductor fabrication. The invention concerns production of porous III-V semiconductors having tunable light emitting properties.

BACKGROUND OF THE INVENTION

Group III-V materials possess light emitting properties, the properties of which are determined by the electronic band structure. In turn, the band structure is a function of the elemental composition of the material. A great deal of effort has been devoted to developing processed forms of III-V semiconductors with tunable light emission properties, e.g., quantum wells, wires and dots, superlattices, and bandgap engineered materials. Silicon, in its naturally occurring elemental form, is not light emitting. Silicon may be changed to porous silicon, a modified form of silicon. The unique electronic, morphological, and thermal properties of porous silicon make it useful for a range of applications. Porous silicon may even be light emitting, making it useful in optoelectronics. The successful development of porous silicon suggests that if III-V semiconductors could be made porous efficiently they might also display interesting characteristics.

In addition to potential applications in silicon-based optoelectronics, porous silicon has been used as an antireflective coating for silicon solar cells. Chemically modified porous silicon may be useful in chemical and biochemical sensing. Porous silicon can serve as an efficient matrix for direct introduction of high mass biomacromolecules in mass spectrometry. In sum, porous silicon is useful in numerous applications and is likely to find many additional uses in the future.

Conventional methods for producing porous silicon are often time-consuming, difficult, or ineffective in producing stable porous silicon structures. Equipment such as a potentiostats and illuminating light sources are required in etching processes of conventional porous silicon production methods. Porous silicon is normally produced by anodic etching, with (n-type) or without (p-type) illumination. In the anodic etch process mobile holes are electrically driven to the silicon-electrolyte interface where they participate in the oxidative dissolution of surface silicon atoms. Spatial anisotropy results from the potential barrier developed at the sharp tips of the evolving structures, which blocks further hole transport thus preventing further etching and giving rise to the porous structure. Porous silicon has also been made without external bias by chemical etching in $HNO_3$/HF solutions (stain etching), and by photochemical etching.

Stain etching is typically slow (characterized by an induction period), inconsistent in result, unreliable in producing light-emitting porous silicon and is not readily amenable to lateral patterning. Stain etching is mainly used for making very thin porous silicon layers. Recently, it was shown that evaporating and annealing 150–200 nm of aluminum (Al) on Si results in more rapid stain etching. However, the porous silicon produced by this aluminum enhanced stain etching was approximately ten times weaker in luminescence than anodically etched porous silicon of a similar thickness, and the process still exhibits an induction period prior to commencement of etching. See, D. Dimova Malinovska et al., "Thin Solid Films", 297, 9–12 (1997). It has also been reported that Pt could be deposited electrochemically from a Pt (IV) solution onto Si during etching to produce lightemitting porous silicon, although it proved difficult to control the applied potential to affect both silicon etching and Pt deposition simultaneously. See, P. Gorostiza, R. Diaz, M. A. Kulandainathan, F. Sanz, and J. R. Morante, J. Electroanal. Chem. 469, 48 (1999).

Group III-V materials have characteristic emission bands. For nearly a decade, GaN-based materials have been the subject of intensive research for optoelectronics applications in the short-wavelength range. Despite the lack of bulk GaN substrates, GaN-based devices have been made possible by advances in materials growth. Research targeting GaN and related ternary materials and development of devices based on these materials have intensified in the past few years due to the evident value of short-wavelength optical devices and high power electronic devices based on this system. Because bulk GaN substrates are not available for epitaxial growth, GaN is most often grown on sapphire or SiC. Growth of high-quality GaN-based materials on these substrates must overcome the limitations posed by the large mismatch in lattice constants (e.g., 14% for sapphire) and thermal coefficients, so material quality has been studied extensively by both structural and optical techniques.

SUMMARY OF THE INVENTION

Because the interest in GaN centers around its shortwavelength light emission properties, it would be of great technological interest if the emission could be moved to even shorter wavelengths (<368 nm), or equivalently higher energies, than that observed from bulk epitaxial GaN.

The present method produces porous Group III-V material with tunable morphologies and light emitting properties. In the method of the invention, a thin discontinuous metal layer is deposited on a Group III-V material surface. Preferred metals are Pt and Au. Au tends to produce a smoother morphology, while Pt tends to shift the Group III-V conduction band further toward the blue region. It is important that the deposited layer be sufficiently thin that it forms a discontinuous film, thereby providing access of etchant species to the Group III-V material surface in the area of the deposited metal. The surface is then etched in a solution including HF and an oxidant for a brief period, as little as 2 seconds to as much as 60 minutes. A preferred oxidant is $H_2O_2$. Morphology and light emitting properties of porous Group III-V material can be selectively controlled as a function of the type of metal deposited, doping type, thickness of metal deposit, doping level, whether emission is collected on or off the metal coated areas, and etch time. It is important that etching occurs both directly under the metal-coated area and in areas adjacent to the metal coated areas. Electrical assistance is unnecessary during the chemical etching of the invention.

DETAILED DESCRIPTION OF THE INVENTION

In the method of the invention, a thin discontinuous layer of metal is deposited on a Group III-V material surface. The surface is then immersed for a short time in an oxidizing HF solution to produce porous material. The etching reaction may be carried out in the presence or absence of external illumination, and is conducted in the absence of external electrical bias. Through the invention, Group III-V materials with different morphologies and luminescence properties can be rapidly produced by varying: the type of metal deposited, the dopant type, whether emission is collected on or off the metal coated areas, the dopant level, the time of etching, and the amount of metal deposited. Because much of the metal remains, even after prolonged etching, the invention may be used to produce Group III-V material with built-in metal contacts, by choosing a metal of interest for forming ohmic contact to the resulting porous material.

The preferred embodiments of the present invention demonstrate the production of porous Group III-V materials. A preferred example is a porous form of GaN. The method to produce porous Group III-V material will be illustrated with respect to experiments conducted to produce porous GaN. Understanding of the invention will be aided by a description of the work of the present inventors to produce porous silicon (PSi). Description for steps to produce PSi are accordingly included herein.

Samples of porous GaN and PSi have been produced in laboratory-scaled experiments. Artisans will recognize the general applicability and scalability of the invention as a routine extension of the experiments conducted to demonstrate the invention. In the silicon production experiments, silicon (100) wafers with different doping levels were used, including: p+ (0.01–0.03 Ωcm), p– (1–10 Ωcm), n+ (0.005–0.02 Ωcm) and n– (10–20 Ωcm) Si. 30–80 Å of metal (Au, Pt, or Au/Pd) was sputtered onto Si(100), producing metal structures with ~10 nm characteristic lateral dimensions as revealed by atomic force microscopy (AFM). Removing native oxide from the silicon wafers before sputter coating is not necessary. Aqueous $H_2O_2$ was added to aqueous HF/EtOH solution in a Teflon beaker to produce a solution of 1:1:1 EtOH:HF(49%): $H_2O_2$ (30%) immediately prior to immersing the metal-coated wafers. Etching time can be varied from 2 seconds to 60 min. A mask with rows of 3 mm diameter holes spaced by 6 mm was used to pattern the metal deposition for comparison of etching and luminescence properties in the presence and absence of deposited metal. The development of the pattern deposited using this mask was observed visually upon immersion in the etching solution, with a color change in the metal-coated region from gray to brown then to yellow, depending on the elapsed etching time. Gas evolution from the metal coated area was clearly observed, especially for Pt and Au/Pd. In no case was any metal dissolution observed, in contrast to the behavior if thick continuous layers of evaporated Al were deposited prior to etching. A high-resolution field emission SEM (Hitachi S4700) was used to characterize the surface morphology, both in-plane and in cross-section. A SPEX fluorimeter equipped with a 500 W Xe lamp excitation source, two monochromators and a Hamamatsu RT220P PMT, was used to examine the photoluminescence (PL) spectral behavior. Luminescence images were acquired on an inverted microscope (Zeiss Axiovert 100) equipped with a 150 W Hg lamp and a color camera (Sony Medical Instruments, Model DCX 9000).

In Group III-V production experiments, epitaxial GaN was converted to porous GaN. Electrically stimulated light emission of the porous GaN is blue-shifted compared to the bulk GaN. GaN epitaxially grown on SiC wafers was used. A thin (30-400 Å) layer of Pt was sputtered onto the epitaxial GaN, with thicknesses below 100 Å producing discontinuous metal structures with ~10 nm characteristic lateral dimensions as revealed by atomic force microscopy. The metal structures are discontinuous on the GaN surface. 30% $H_2O_2$ was added to aqueous HF in a Teflon beaker immediately prior to immersing the metal coated wafers, and the wafers were treated in this solution in the presence of a lower power ultraviolet light source. Dipping time was varied from 1–80 minutes. A mask with rows of 3 mm holes spaced by 6 mm was used to pattern the metal deposition for comparison of the etching behavior and resulting materials properties in the presence and absence of the deposited metal. The development of pattern deposited using this mask upon dipping in the etching solution was visually observed. Gas evolution from the metal coated area was clearly observed.

The etching procedure produces a porous GaN structure, which was observed by scanning electron microscopy. The porous GaN has a gradation of crystalline sizes from the top (surface) to the bottom (depth of porous structure). The light emission properties of such etched GaN structures were observed. The bandgap light emission from bulk unetched GaN would be present at 368 nm, so both peaks at 334 nm and 356 nm observed in the etched material are blue-shifted relative to the unperturbed bandgap emission. At moderate etch times, for example 40 minutes, the maximum amount of 334 nm emission is observed from the areas proximal to, but not directly beneath, the metal coated areas. The 356 nm emission is obtained from areas complementary to the 334 nm emission. Higher beam energies penetrate deeper into the structure producing emission from greater depths and larger volumes. A 334 nm light emission was determined to be primarily from the top of the etched structure. The morphology and the optical properties of the etched GaN were found to depend on: the metal coated, whether the emission is collected on or off the metal coated areas, the metal layer thickness, and etching time. Each of these variables permits control of the process to produce a desired porous structure. An additional variable is introduced depending on whether emissions are collected on or off of the metal coated areas.

SEM images of an Au-coated p+ Si wafer subjected to HF-oxidant etching for 30 seconds revealed large (~30 nm) interconnected pores propagating anisotropically perpendicular to the surface, similar to the morphology observed on anodically etched PSi from heavily doped Si the pores are observed on the Au-coated areas. In contrast, in areas between the Au on the same wafer, a much more compact structure with random arrays of small pores (~3 nm spaced by about 3 nm) can be seen, similar to anodically etched porous silicon from moderately doped (p–) silicon wafers. The etching depth is about 350 nm and on the Au-coated areas and 250 nm off the Au-coated areas. For n+ and p– silicon etched under identical conditions, the morphology in the Au-coated areas exhibits columnar structure similar to a p+ sample produced by the invention, with small variations in pore size and etching depth. Off the Au-coated areas on both n+ and p– silicon the morphology resembles that of p+ samples. A significantly smaller etch depth of 10 nm was obtained for an Au-coated p– wafer.

Etching may also be achieved with other metals. Pt-coated areas of a p+-silicon were subjected to HF-oxidant etching for 30 seconds. The Pt-coated sample results in a rougher and deeper structure than the Au-coated sample. In the Pt-coated area, columnar structures are clustered together at the tip, and the etch depth exceeds 1 μm. An area on the same wafer without Pt is flat with small (~5–20 nm) interconnected pores, and the etch depth is 320 nm—small compared to the Pt-coated area but deeper than comparable areas on the Au-coated sample. For p– wafers, the etch depths on and off Pt-coated areas are about 300 nm and 35 nm, respectively. The p– wafers display smoother top morphology on the Pt-coated areas, while the off-Pt areas are rougher in depth than those for p+ wafers.

HF-oxidant etching of Si coated with Au/Pd in a one-to-one ratio was also studied. The morphology and luminescence properties of the PSi produced were similar to Pt-coated Si. For all doping concentrations examined (p+, p– and n+), metal-coated areas always exhibit larger pores with columnar structure, while the off-metal areas always display smaller pores (3–5 nm) and randomly oriented structures. In each case, the exact pore sizes and connectivity vary with doping levels and etching time, producing large differences in luminescence properties.

Comparing relative etch rates reveals that Pt-assisted HF-oxidant etching proceeds much faster than Au-assisted etching. More importantly, PSi produced with Pt shows more intense photoluminescence (PL) than those produced by Au-assisted HF-oxidant etching. Furthermore, depending on the doping type, doping level, and etching time, luminescence patterns can be formed which are correlated with the metal deposition pattern Luminescence images of HF-oxidant etched p+ and p– Si patterned with circular Pt areas were taken. Stronger PL was seen from the Pt-coated area for p+ wafer, while the uncoated area provides stronger PL in the p– sample. Stronger PL is also obtained from the Pt-coated areas on n+ Si. PL spectra taken from different areas on differently doped samples were also taken. The thin layer (35 nm) in the off Pt areas of p– Si produced the strongest PL intensity among all samples, and was more intense than 10 times the thickness of PSi produced by anodic etching. In addition, the PL peaks are centered at 590 nm, which is blue shifted –100 nm from PSi formed by anodic etching. Furthermore, with etch times longer than 5 min the resulting material displays a blue-shifted emission spectrum, with the wavelength of maximum emission scaling with etch time from 650 nm at 5 min (or shorter) to less than 500 nm at 60 min for p⁻ Si.

AFM imaging indicates that these thin metal coatings on Si appear as nanometer size (~10 nm) islands prior to etching, with thermal annealing producing larger islands. However, the PSi pore sizes produced have no direct correspondence with the size or spacing of the deposited metal islands, i.e., the metal-coating does not act as an etch-mask. Etching according to the invention works not only for p-type Si but also for n-Si, even in the dark. Control experiments, in which wafers without metal-coatings were immersed for the same period of time in $H_2O_2$/HF/EtOH, produced no morphological features observable by SEM and no detectable PL. The results clearly indicate that a thin discontinuous layer of metal is required for Si and Group III-V material etching, with Pt producing the fastest etching rate and most intensely luminescent PSi. In fact, these metals are required to obtain chemical etching under the conditions employed here. Prolonged (up to 60 min) etching of Au-coated Si can produce PSi that is rough and deep but never as strong in PL as those produced with Pt.

Strongly luminescent PSi can also be produced adjacent to, but macroscopic distances away from, the metal-coated areas, in contrast to control experiments in which the absence of a metal coating correlates with the lack of detectable etching. This suggests that lateral transport of charge carriers and chemical species occurs during etching. Etching by the invention may occur as a localized electrochemical process, with the nanometer-sized metal acting as a local cathode. By this model, microscopically local anode (Si) and cathode (metal) sites form on the etched surface with local cell currents flowing between the sites during etching. The reaction at the cathode generates holes, while the reaction at the anode consumes them in the dissolution of Si. In analogy with the pioneering studies of Si anodic etching, the following mechanism is proposed for the present electroless etching of silicon, Cathode reaction (at metal)

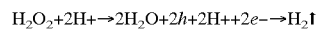

Anode reaction

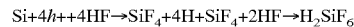

Overall reaction

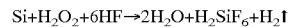

A critical feature of this reaction scheme is the generation of h+ from $H_2O_2$ and the reduction of $H^+$ to form $H_2$, both of which are facilitated by the metal particles. Since h+ derives from $H_2O_2$, this mechanism indicates that PSi can be generated in the same way regardless of doping type and level, as was observed experimentally. However, the difference in doping level is reflected in the etch depth away from metal-coated areas. In the uncoated areas, higher doping correlates with faster etching and deeper etch depths at fixed times. Since the higher conductivity of the n+ and p+ samples relative to p– samples would facilitate carrier transport, this observation is also consistent with the above mechanism. The observation of much higher etch rates for Pt and Pd than Au suggest a catalytic role, but we do not have direct evidence of catalysis at this time. Finally, the proposed $H_2O_2$ is but one possible oxidant, and others may work as well or better—the key feature being the ability to generate mobile holes at the metal-solution interface.

Rutherford back scattering analysis and X-ray photoelectron spectroscopy show that some metal remains on the metal coated areas of the silicon surface after etching by the invention and rigorous rinsing, showing that etching of the invention should provide in situ metal contacts for PSi. The effect is expected to be present in the Group III-V porous structure as well. Making contacts to PSi is important for devices with PSi top layers, because the fragile and unstable nature of the porous layer makes it difficult to accomplish without altering the properties of the PSi. The corollary discovered to the porous GaN production indicates that varying the etching steps similarly to the porous Si production has similar effects. As discussed above, the morphology and emission spectra of GaN may also be selectively controlled through the invention.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for producing porous Group III-V material, the method comprising steps of:

depositing a thin discontinuous layer of metal on a Group III-V material surface;

forming the porous Group III-V material by etching the Group III-V material surface in a HF and oxidant solution, said etching being conducted without external electrical bias.

2. The method according to claim 1, wherein said step of etching is conducted in the absence of illumination.

3. The method according to claim 1, wherein said step of etching is conducted in the presence of illumination.

4. The method according to claim 1, wherein said metal comprises Pt.

5. The method according to claim 1, wherein said metal comprises Au.

6. The method according to claim 1, wherein said metal comprises Pd.

7. The method according to claim 1, wherein said metal comprises a combination of metals selected from the group consisting of Au, Pt and Pd.

8. The method according to claim 1, wherein said oxidant comprises $H_2O_2$.

9. The method according to claim 1, wherein the thickness of said metal is less than approximately 10 nm.

10. The method according to claim 1, wherein said etching is conducted for a time period between about 2 seconds and one hour.

11. The method according to claim 1, wherein said Group III-V material comprises GaN.

12. A method for producing porous Group III-V material, the method consisting of the following steps:

depositing a thin discontinuous layer of metal on a Group III-V material surface;

forming the porous Group III-V material by etching the Group III-V material surface in a HF and oxidant solution for a period of about two seconds up to 60 minutes.

13. The method according to claim 12, wherein said step of etching is conducted in the absence of illumination.

14. The method according to claim 12, wherein said step of etching is conducted in the presence of illumination.

15. The method according to claim 12, wherein said metal comprises Pt.

16. The method according to claim 12, wherein said metal comprises Au.

17. The method according to claim 12, wherein said metal comprises Pd.

18. The method according to claim 12, wherein said metal comprises a combination of metals selected from the group consisting of Au, Pt and Pd.

19. The method according to claim 12, wherein said oxidant comprises $H_2O_2$.

20. The method according to claim 12, wherein the thickness of said metal is less than approximately 10 nm.

21. The method according to claim 12, wherein said etching is conducted for a time period between about 2 seconds and one hour.

22. The method according to claim 12, wherein said Group III-V material comprises GaN.

23. A method for producing porous Group III-V material, the method comprising steps of:

depositing metal on a Group III-V material surface in a thickness sufficient to permit nucleation that forms nanometer size metal particles and small enough to prevent formation of a continuous metal layer;

forming the porous Group III-V material by etching the Group III-V material surface in a HF and oxidant solution for a period of about two seconds up to 60 minutes, said etching being conducted without external electrical bias.

* * * * *